United States Patent
Hino et al.

(10) Patent No.: US 7,673,216 B2
(45) Date of Patent: Mar. 2, 2010

(54) CACHE MEMORY DEVICE, SEMICONDUCTOR INTEGRATED CIRCUIT, AND CACHE CONTROL METHOD

(75) Inventors: Mitsuaki Hino, Kawasaki (JP); Akira Nodomi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 738 days.

(21) Appl. No.: 11/295,562

(22) Filed: Dec. 7, 2005

(65) Prior Publication Data

US 2007/0044004 A1    Feb. 22, 2007

(30) Foreign Application Priority Data

Aug. 4, 2005    (JP)    ............... 2005-226764

(51) Int. Cl.
*H03M 13/00* (2006.01)
(52) U.S. Cl. ...................... 714/758; 711/118
(58) Field of Classification Search ............. 714/758, 714/746, 773, 764, 803, 755; 711/108, 111, 711/118–140; 365/49
See application file for complete search history.

(56) References Cited

U.S. PATENT DOCUMENTS

| 7,404,136 B2 * | 7/2008 | Ruckerbauer et al. ........ 714/758 |
| 2004/0199851 A1 * | 10/2004 | Quach et al. ................. 714/758 |

FOREIGN PATENT DOCUMENTS

| JP | 64-078498 | 3/1989 |
| JP | 01-223700 | 9/1989 |
| JP | 03-122739 A | 5/1991 |

\* cited by examiner

*Primary Examiner*—Sam Rizk
(74) *Attorney, Agent, or Firm*—Fujitsu Patent Center

(57) ABSTRACT

A memory cache device in which a storage area used for a memory data protection function is effectively used at the time of not using the memory data protection function. A mode selection signal makes ECC code sections for storing an ECC code function as a storage area for storing ECC codes used for performing error detection or error correction on data stored in data RAMs at the time the memory data protection function is enabled and as a way added to the data RAMs at the time the memory data protection function is disabled.

6 Claims, 8 Drawing Sheets

CACHE MEMORY DEVICE, SEMICONDUCTOR INTEGRATED CIRCUIT, AND CACHE CONTROL METHOD

CROSS-REFERENCE TO RELATED APPLICATIONS

This application is based upon and claims the benefits of priority from the prior Japanese Patent Application No. 2005-226764, filed on Aug. 4, 2005, the entire contents of which are incorporated herein by reference.

BACKGROUND OF THE INVENTION (1) Field of the Invention

This invention relates to a cache memory device, a semiconductor integrated circuit, and a cache control method and, more particularly, to a cache memory device with a memory data protection function based on a parity function or an error checking and correcting (ECC) function, a semiconductor integrated circuit, and a cache control method.

(2) Description of the Related Art

In computer systems which call for high reliability, various techniques for supporting high reliability are used for components, such as central processing units (CPUs), cache memories, main memories, and I/O devices.

With cache memories, for example, the correctness of their contents must be guaranteed to improve data reliability. An error detection method based on parity or an error detection and correction method based on ECC is used for guaranteeing the correctness of the contents of cache memories.

An example of a conventional cache memory device is given below.

FIG. 7 shows the structure of an example of a conventional cache memory device in which an ECC function is used for data random access memories (RAMs).

In this example, a cache memory device 800a includes n ways (storage blocks) WAY0, WAY1, ..., and WAY(n-1). An address used when a CPU (not shown) accesses a main memory (not shown) is also shown. The cache memory device 800a includes n tag RAMs 801-1, 801-2, ..., and 801-n, n comparators 802-1, 802-2, ..., and 802-n, n data RAMs 803-1, 803-2 ... and 803-n, n ECC code sections 804-1, 804-2, ..., and 804-n, selectors 805 and 806 for selecting a way in accordance with a way selection signal, and an error detection and correction section 807.

The tag RAMs 801-1 through 801-n each store tag information. The tag information is designated by a low order bit address (index address) of an address specified by the CPU (not shown) and is read out. Tag information outputted from the tag RAMs 801-1 through 801-n by using the same index address differs among the ways.

The comparators 802-1 through 802-n respectively compare a high order bit address (tag address) of the address specified by the CPU (not shown) and the tag information read out from the tag RAMs 801-1 through 801-n, and output a way selection signal for selecting a way in which they match.

The data RAMs 803-1 through 803-n store part of data stored in, for example, the main memory (not shown) and output data specified by the index address.

The ECC code sections 804-1 through 804-n store ECC codes corresponding to the data stored in the data RAMs 803-1 through 803-n, respectively, and output ECC codes specified by the index address.

In accordance with the way selection signal, the selector 805 selects and outputs data read out from one of the data RAMs 803-1 through 803-n included in the way selected.

In accordance with the way selection signal, the selector 806 selects and outputs an ECC code read out from one of the ECC code sections 804-1 through 804-n included in the way selected.

By using the ECC code, the error detection and correction section 807 detects a 1- or 2-bit error and corrects the 1-bit error.

The operation of the conventional cache memory device 800a will now be described.

When the CPU (not shown) accesses the main memory (not shown), the tag information specified by the index address is read out from the tag RAMs 801-1 through 801-n. The comparators 802-1 through 802-n respectively compare the tag address and the tag information read out from the tag RAMs 801-1 through 801-n, and output the way selection signal for selecting the way in which they match.

On the other hand, the data specified by the index address is read out from the data RAMs 803-1 through 803-n. Similarly, the ECC codes specified by the index address are read out from the ECC code sections 804-1 through 804-n. The selector 805 selects the data read from one of the data RAMs 803-1 through 803-n included in the way specified by the way selection signal and inputs it to the error detection and correction section 807. The selector 806 selects the ECC code read out from one of the ECC code sections 804-1 through 804-n included in the way specified by the way selection signal and inputs it to the error detection and correction section 807.

It is assumed that the tag information stored in the way WAY0 matches the tag address inputted as a result of comparisons made by the comparators 802-1 through 802-n. Then the selector 805 selects the data stored in the data RAM 803-1 in the way WAY0 and the selector 806 selects the ECC code stored in the ECC code section 804-1 in the way WAY0. The selected data and ECC code are inputted to the error detection and correction section 807.

By using the data inputted and the corresponding ECC code, the error detection and correction section 807 then detects a 1- or 2-bit data error, corrects the 1-bit data error, and outputs the data.

As stated above, with the conventional cache memory device 800a the ECC codes stored in the ECC code sections 804-1 through 804-n are used for detecting and correcting an error. By doing so, high reliability is actualized. The case where ECC codes are used has been described. However, the major part of the above description applies to the case where a parity function is used. A cache memory device includes an area where parity check bits corresponding to data stored are held, and an error is detected by using a parity check bit.

By the way, memory data protection using a parity function or an ECC function is unnecessary to some uses for a system. In such cases, manufacturing cache memory devices without a memory data protection function and cache memory devices with a memory data protection function causes the problem of delivery time or costs. Accordingly, a technique for nullifying a memory data protection function included in a cache memory device by, for example, a control signal at the time of not using it is proposed (see, for example, Japanese Patent Laid-Open Publication No. Sho64-78498 or No. Hei1-223700).

FIG. 8 shows a conventional cache memory device in which a memory data protection function can be nullified.

Components that are the same as those shown in FIG. 7 are marked with the same symbols and descriptions of them will be omitted.

A cache memory device 800b includes a selector 808 for selecting output from a selector 805 or output from an error detection and correction section 807 in accordance with a mode selection signal.

To nullify an ECC function of the cache memory device 800b, a mode selection signal is used for making the selector 808 select and output output from the selector 805. To use the ECC function of the cache memory device 800b, a mode selection signal is used for making the selector 808 select and output an error correction result outputted from the error detection and correction section 807.

However, if a memory data protection function based on a parity function or an ECC function is nullified, then data stored in an area for storing parity check bits or ECC codes is not used. As a result, the storage area where the data is held will waste.

SUMMARY OF THE INVENTION

The present invention was made under the background circumstances described above. An object of the present invention is to provide a cache memory device in which a storage area used for a memory data protection function can effectively be used at the time the memory data protection function is not used.

Another object of the present invention is to provide a semiconductor integrated circuit including the cache memory device in which a storage area used for a memory data protection function can effectively be used at the time the memory data protection function is not used.

Still another object of the present invention is to provide a cache control method by which a storage area used for a memory data protection function can effectively be used at the time the memory data protection function is not used.

In order to achieve the above first object, a cache memory device which has a memory data protection function based on a parity function or an ECC function and in which whether to make the memory data protection function enabled or disabled can be selected by a selection signal is provided. This cache memory device comprises a data storage section including one or more ways for storing part of data stored in a main memory; a tag information storage section for storing tag information which differs among the one or more ways; and a storage section which functions by the selection signal as a storage area for storing memory data protection data used for performing error detection or error correction on the data at the time the memory data protection function is enabled and which functions by the selection signal as one or more ways added to the data storage section at the time the memory data protection function is disabled.

In order to achieve the above second object, a semiconductor integrated circuit including a cache memory device which has a memory data protection function based on a parity function or an ECC function and in which whether to make the memory data protection function enabled or disabled can be selected by a selection signal is provided. This cache memory device comprises a data storage section including one or more ways for storing part of data stored in a main memory; a tag information storage section for storing tag information which differs among the one or more ways; and a storage section which functions by the selection signal as a storage area for storing memory data protection data used for performing error detection or error correction on the data at the time the memory data protection function is enabled and which functions by the selection signal as one or more ways added to the data storage section at the time the memory data protection function is disabled.

In order to achieve the above third object, a cache control method for the cache memory device which includes one or more ways, which has a memory data protection function based on a parity function or an ECC function, and in which whether to make the memory data protection function enabled or disabled is selected by a selection signal is provided. This cache control method comprises the step of making a storage section which functions as a storage area for storing memory data protection data used for performing error detection or error correction on data stored in a data storage section and corresponding to part of data stored in a main memory at the time the memory data protection function is enabled function as one or more ways added to the data storage section by the selection signal at the time the memory data protection function is disabled.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described in detail with reference to the drawings.

Figure 1:
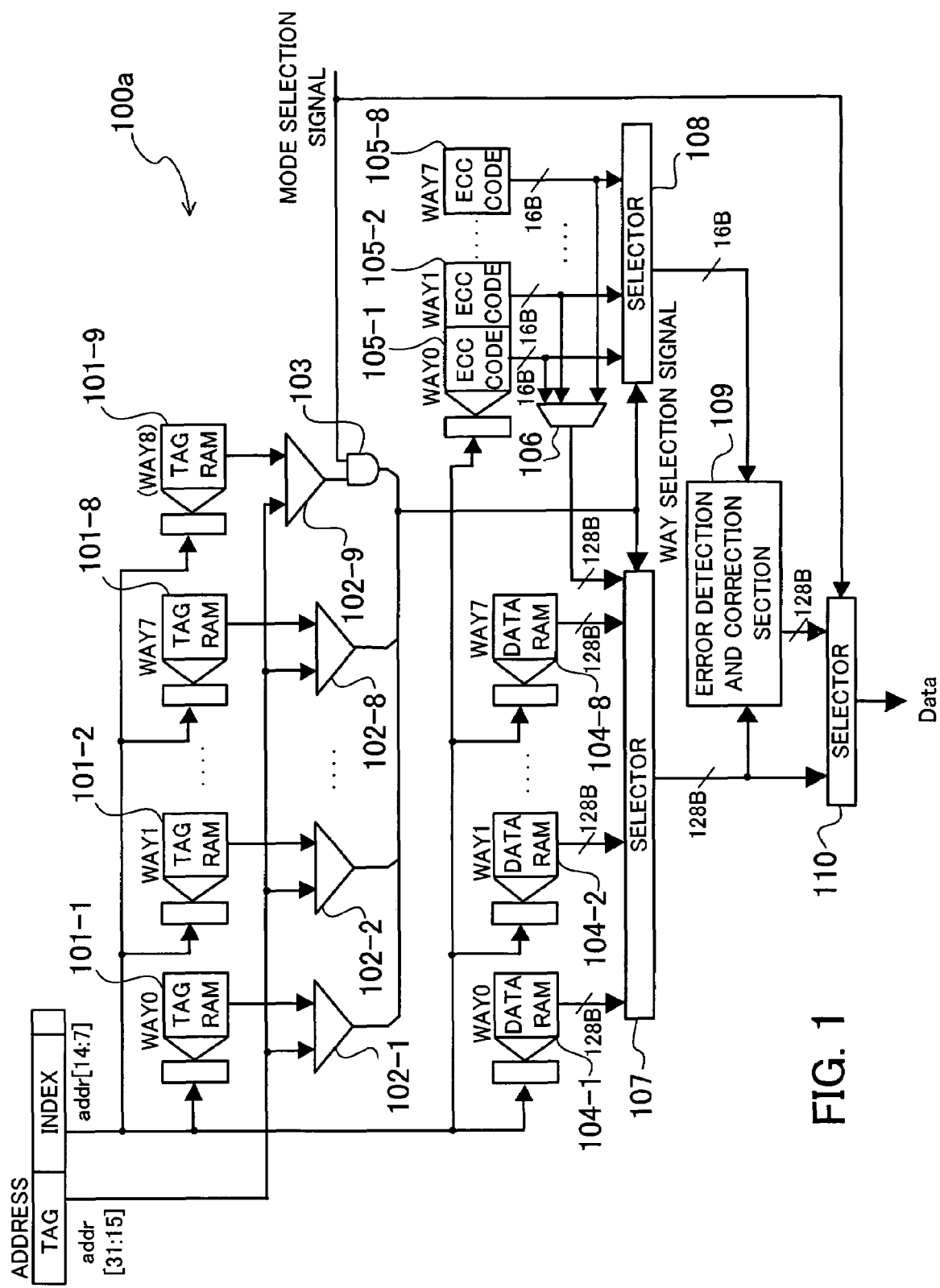
FIG. 1 shows the structure of a cache memory device according to a first embodiment of the present invention.

FIG. 1 shows the structure of a cache memory device according to a first embodiment of the present invention.

Figure 2:
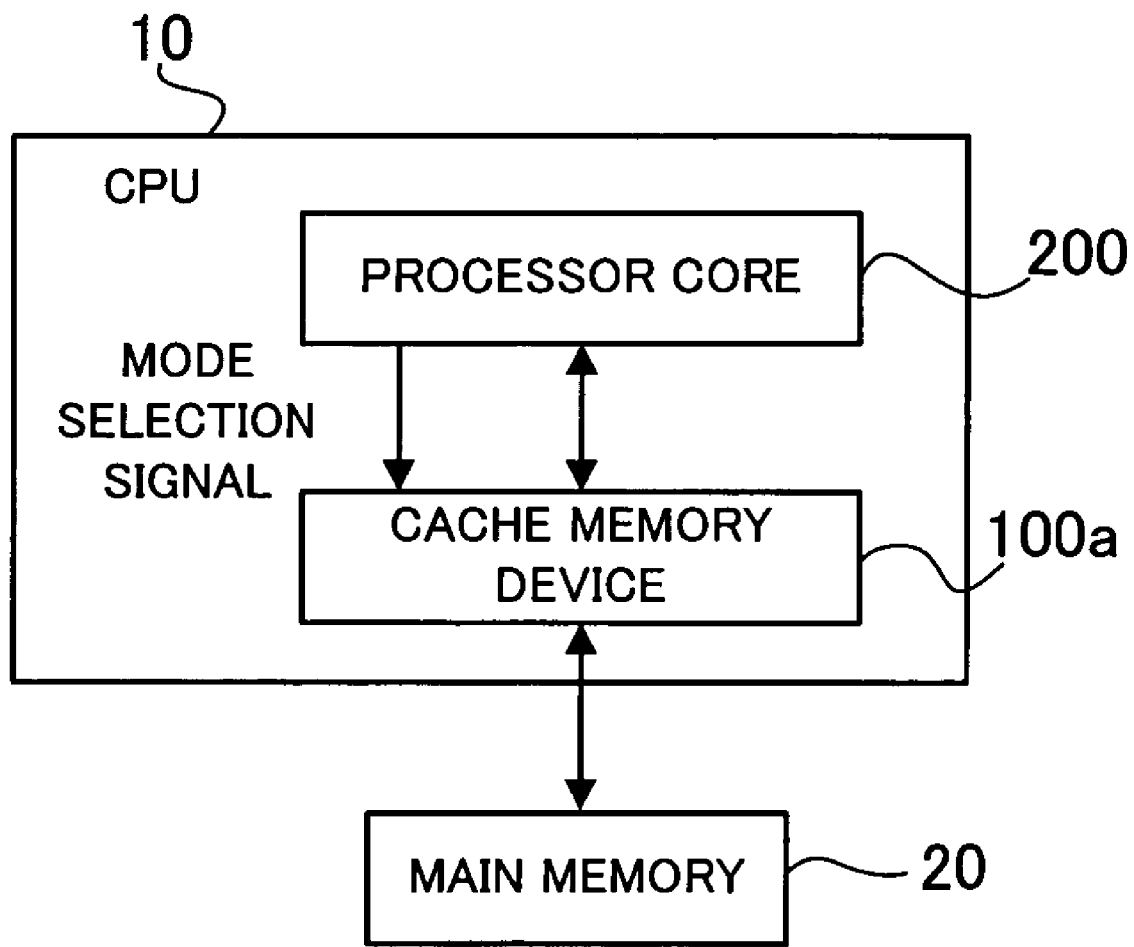
FIG. 2 is a schematic view showing the configuration of a system comprising a CPU including the cache memory device and a main memory.

FIG. 2 is a schematic view showing the configuration of a system comprising a CPU including the cache memory device and a main memory.

As shown in FIG. 2, a CPU 10 includes a cache memory device 100a for storing part of data stored in a main memory 20 and a processor core 200. For example, the cache memory device 100a and the processor core 200 are formed on one semiconductor integrated circuit chip. A mode selection signal inputted from the processor core 200 to the cache memory device 100a is used for making a memory data protection function of the cache memory device 100a enabled or disabled. The mode selection signal may be inputted from the outside of the CPU 10.

The cache memory device 100a shown in FIG. 2 functions as a primary cache, but it may function as a secondary cache or a tertiary cache.

As shown in FIG. 1, the cache memory device 100a according to the first embodiment of the present invention is of an 8-way set associative type (when the memory data protection function is enabled). For example, the cache memory device 100a has a cache capacity of 256 KB and its line size is 128 B. In addition, the cache memory device 100a has an ECC function as the memory data protection function. The memory data protection function is made enabled or disabled by, for example, the mode selection signal inputted from the processor core 200. It is assumed that when the mode selection signal is "0," the memory data protection function is enabled and that when the mode selection signal is "1," the memory data protection function is disabled.

The structure of the cache memory device 100a will now be described in detail.

The cache memory device 100a includes tag RAMs 101-1, 101-2, ..., 101-8, and 101-9 for storing tag information which differs among ways, comparators 102-1, 102-2, ..., 102-8, and 102-9 for comparing a tag address made up of high order bits of an address designated when the CPU 10 accesses the main memory 20 and the tag information, and an AND circuit 103 in which output from the comparator 102-9 is inputted to one input terminal thereof and the mode selection signal is inputted to the other input terminal thereof. The cache memory device 100a also includes data RAMs 104-1, 104-2, ..., and 104-8 for storing part of data stored in the main memory 20, ECC code sections 105-1, 105-2, ..., and 105-8 for storing an ECC code used for performing error detection or error correction at the time the memory data protection function is enabled, a data merge section 106 for merging data outputted from the ECC code sections 105-1 through 105-8, selectors 107 and 108 for selecting a way in accordance with a way selection signal, an error detection and correction section 109 for performing error detection or error correction by using the ECC code, and a selector 110 for selecting output from the selector 107 or an error correction result outputted from the error detection and correction section 109 in accordance with the mode selection signal.

The tag RAMs 101-1 through 101-9 store tag information which differs among ways. This tag information is read out by using an index address made up of low order bits (by, for example, addr[14:7] made up of 8 bits) of an address (made up of, for example, 32 bits) designated when the CPU 10 accesses the main memory 20. Tag information outputted from the tag RAMs 101-1 through 101-9 by using the same index address differs among the ways.

The comparators 102-1 through 102-9 respectively compare the tag address (for example, addr[31:15] made up of 17 bits) designated when the CPU 10 accesses the main memory 20 and the tag information read out from the tag RAMs 101-1 through 101-9. If tag information read out from one of the tag RAMs 101-1 through 101-9 matches the tag address, then a way including the tag RAM is treated as "Hit WAY" and a way selection signal for designating data stored in the way is outputted. However, output from the comparator 102-9 is inputted to one input terminal of the AND circuit 103 and the mode selection signal is inputted to the other input terminal of the AND circuit 103. When the memory data protection function is disabled (the mode selection signal is "1"), the AND circuit 103 outputs a way selection signal for selecting an additional way (WAY8) if the tag address matches the tag information read out from the tag RAM 101-9 by using the index address. When the memory data protection function is enabled (the mode selection signal is "0"), output from the AND circuit 103 is fixed at 0. That is to say, even if the tag address matches the tag information read out from the tag RAM 101-9, the AND circuit 103 does not output a signal for selecting the additional way WAY8.

The data RAMs 104-1 through 104-8 each store part of data stored in the main memory 20 and output (128-bit, for example) line data designated by using the index address.

When the memory data protection function is enabled, the ECC code sections 105-1 through 105-8 store ECC codes which are generated by an ECC code generation section (not shown) and which correspond to the data stored in the data RAMs 104-1 through 104-8, and output (16-bit, for example) ECC codes corresponding to the line data in the data RAMs 104-1 through 104-8 designated by using the index address.

The data merge section 106 merges the (16-bit, for example) data outputted from the ECC code sections 105-1 through 105-8 and outputs it as, for example, 128-bit data stored in WAY8.

In accordance with the way selection signal, the selector 107 selects and outputs data stored in one of the data RAMs 104-1 through 104-8 included in the selected way or the additional way (WAY8).

In accordance with the way selection signal, the selector 108 selects and outputs data stored in one of the ECC code sections 105-1 through 105-8 included in the selected way.

The error detection and correction section 109 uses the ECC code for detecting a 1- or 2-bit error and correcting the 1-bit error.

In accordance with the mode selection signal, the selector 110 selects and outputs output from the selector 107 at the time the memory data protection function is disabled, and selects and outputs an error correction result outputted from the error detection and correction section 109 at the time the memory data protection function is enabled.

The operation of the cache memory device 100a according to the first embodiment of the present invention will now be described by using FIGS. 1 and 2.

The operation of the cache memory device 100a performed at the time the memory data protection function is enabled will be described first.

When the CPU 10 accesses the main memory 20, the address designated by the processor core 200 is inputted to the cache memory device 100a. The tag information is read out from the tag RAMs 101-1 through 101-9 by using the index address of the address designated. The comparators 102-1 through 102-9 respectively compare the tag address of the address designated by the processor core 200 and the tag information read out from the tag RAMs 101-1 through 101-9, and output the way selection signal for selecting a way where they match.

However, when the memory data protection function is enabled, output from the AND circuit 103 is fixed at 0 by the mode selection signal. Accordingly, even if the tag information read out from the tag RAM 101-9 matches the tag address, a way selection signal for selecting the additional way (WAY8) is not outputted. If a way where the tag information read out matches the tag address does not exist, then the main memory 20 is accessed and data and the like are read out from the main memory 20.

The data designated by using the index address is read out from the data RAMs 104-1 through 104-8. Similarly, the ECC codes designated by using the index address are read out from the ECC code sections 105-1 through 105-8. The selector 107 selects data read out from one of the data RAMs 104-1 through 104-8 included in the way designated by the way selection signal and inputs the data to the error detection and correction section 109 and the selector 110. At this time, the data read out from the ECC code sections 105-1 through 105-8 is merged by the data merge section 106 and is inputted to the selector 107 as data stored in the additional way (WAY8). As stated above, however, output from the AND circuit 103 is fixed by the mode selection signal, so the way selection signal for selecting the additional way (WAY8) is not outputted. As a result, the selector 107 does not select the merged data. On the other hand, the selector 108 selects an ECC code read out from one of the ECC code sections 105-1 through 105-8 included in the way designated by the way selection signal and inputs the ECC code to the error detection and correction section 109.

It is assumed that the tag information stored in WAY0 matches the tag address as a result of the comparison by the comparators 102-1 through 102-8. Then the selector 107 selects the 128-bit data read out from the data RAM 104-1 included in WAY0. The selector 108 selects the 16-bit ECC code read out from the ECC code section 105-1 included in WAY0. The selected 128-bit data and 16-bit ECC code are inputted to the error detection and correction section 109.

By using the data inputted and the corresponding ECC code, the error detection and correction section 109 detects a 1- or 2-bit data error, corrects the 1-bit data error, and inputs, for example, 128-bit output data to the selector 110.

When the memory data protection function is enabled, the selector 110 selects and outputs data which is outputted from the error detection and correction section 109 and in which the error has been corrected in accordance with the mode selection signal.

When the memory data protection function is enabled, high reliability can be actualized by the cache memory device 100a in this way.

Next, the operation of the cache memory device 100a performed at the time the memory data protection function is disabled will be described.

When the address designated by the processor core 200 is inputted to the cache memory device 100a, the tag information is read out from the tag RAMs 101-1 through 101-9 by using the index address. The comparators 102-1 through 102-9 respectively compare the tag address and the tag information read out from the tag RAMs 101-1 through 101-9, and output the way selection signal for selecting a way where they match.

In this case, the mode selection signal is "1," which differs from the value at the time the memory data protection function is enabled. Output from the AND circuit 103 depends on output from the comparator 102-9. If the tag information read out from the tag RAM 101-9 matches the tag address, then the way selection signal for selecting the additional way (WAY8) is outputted from the AND circuit 103.

The data designated by using the index address is read out from the data RAMs 104-1 through 104-8. Similarly, the data designated by using the index address is read out from the ECC code sections 105-1 through 105-8. The selector 107 selects data read out from one of the data RAMs 104-1 through 104-8 included in a way designated by a way selection signal and inputs the data to the error detection and correction section 109 and the selector 110. If the way selection signal for selecting the additional way (WAY8) is outputted, then the selector 107 selects data which is stored in the additional way and which is obtained by merging by the data merge section 106.

The selector 108 inputs data read out from one of the ECC code sections 105-1 through 105-8 included in the way designated by the way selection signal to the error detection and correction section 109. However, when the memory data protection function is disabled, the selector 110 selects, in accordance with the mode selection signal, not output from the error detection and correction section 109 but output from the selector 107 and outputs it. As stated above, when the memory data protection function is disabled, data can be stored in the ECC code sections 105-1 through 105-8 as one way. This is the same with the data RAMs 104-1 through 104-8. In this case, the cache memory device 100a is of a 9-way set associative type. For example, the cache memory device 100a has a cache capacity of 288 KB and its line size is 128 B.

As has been described, with the cache memory device 100a according to the first embodiment of the present invention, the ECC code sections 105-1 through 105-8 can effectively be used as a way added to the data RAMs 104-1 through 104-8 even when the memory data protection function is disabled. That is to say, the ECC code sections 105-1 through 105-8 are not wasted. This improves the performance of a cache memory.

The cache memory device 100a shown in FIG. 1 has an ECC function as a memory data protection function. However, the cache memory device 100a shown in FIG. 1 may have a parity function in place of the ECC function.

Figure 3:
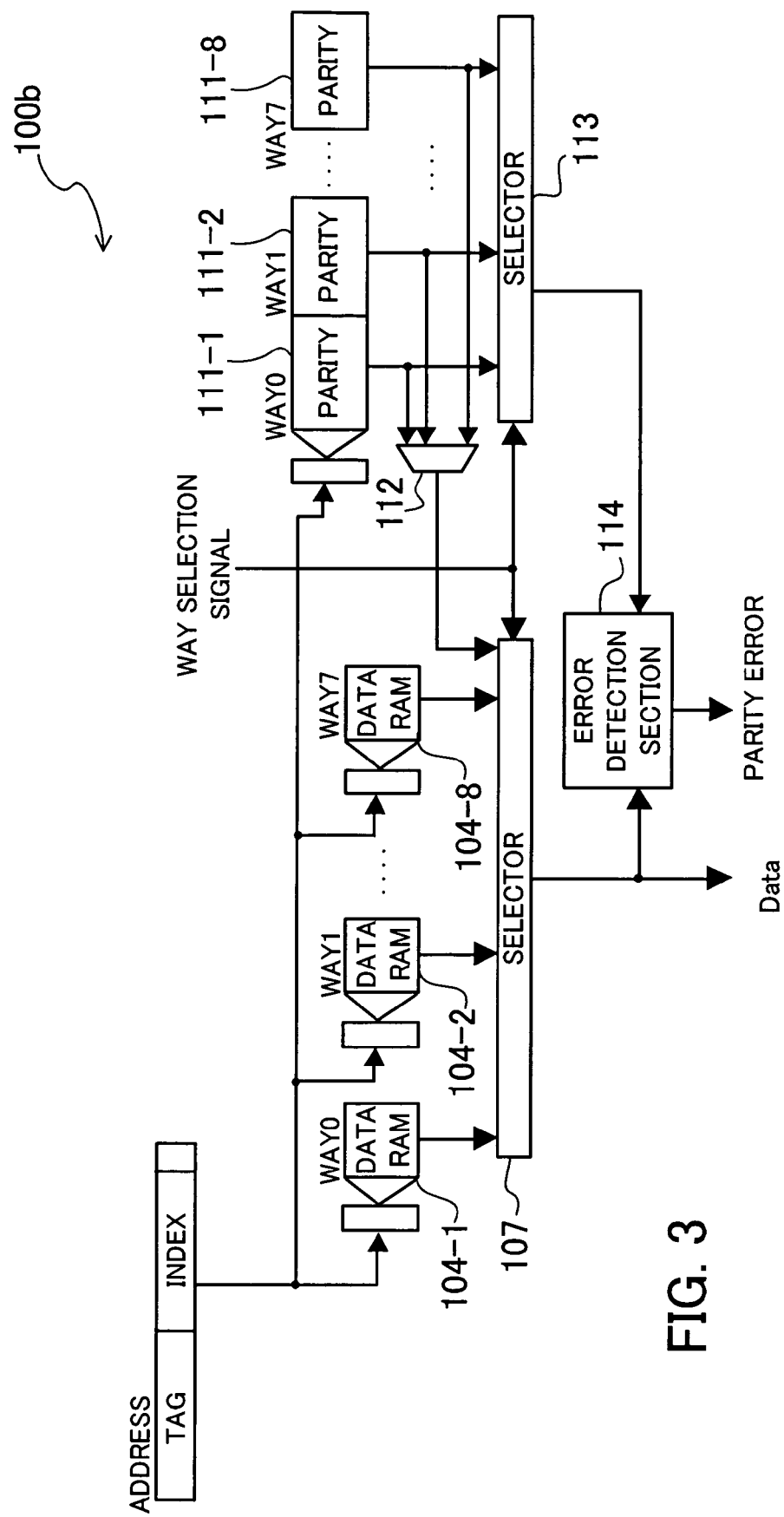
FIG. 3 shows the structure of a cache memory device with a parity function according to the first embodiment of the present invention.

FIG. 3 shows the structure of a cache memory device with a parity function according to the first embodiment of the present invention.

A tag RAM portion is the same as that shown in FIG. 1, so it is not shown in FIG. 3. Components that are the same as those shown in FIG. 1 are marked with the same symbols.

A cache memory device 100b with a parity function as a memory data protection function includes parity check bit sections 111-1, 111-2, . . . , and 111-8 for storing a parity check bit which correspond to data RAMs 104-1 through 104-8 in different ways in place of the ECC code sections 105-1 through 105-8 shown in FIG. 1. A data merge section 112 merges data designated by using an index address and read out from the parity check bit sections 111-1 through 111-8 and inputs merged data to a selector 107 as data stored in an additional way. In accordance with a way selection signal, a selector 113 inputs a parity check bit stored in one of the parity check bit sections 111-1 through 111-8 included in a selected way to an error detection section 114.

As state above, when the memory data protection function is enabled, the data stored in the additional way (data output from the data merge section 112) is not selected by the way selection signal. Accordingly, data stored in one of the data RAMs 104-1 through 104-8 included in ways WAY0 through WAY7, respectively, is selected. The error detection section 114 then uses the parity check bit stored in the selected way for detecting a parity error.

As state above, when the memory data protection function is disabled, the selector 107 selects and outputs the data stored in the additional way (data output from the data merge section 112) in accordance with the way selection signal if tag information stored in the additional way matches a tag address.

As described above, the parity check bit sections 111-1 through 111-8 can effectively be used as a way added to the data RAMs 104-1 through 104-8 even when the memory data protection function is disabled. That is to say, the parity check bit sections 111-1 through 111-8 are not wasted. This improves the performance of a cache memory.

A cache memory device according to a second embodiment of the present invention will now be described.

Figure 4:
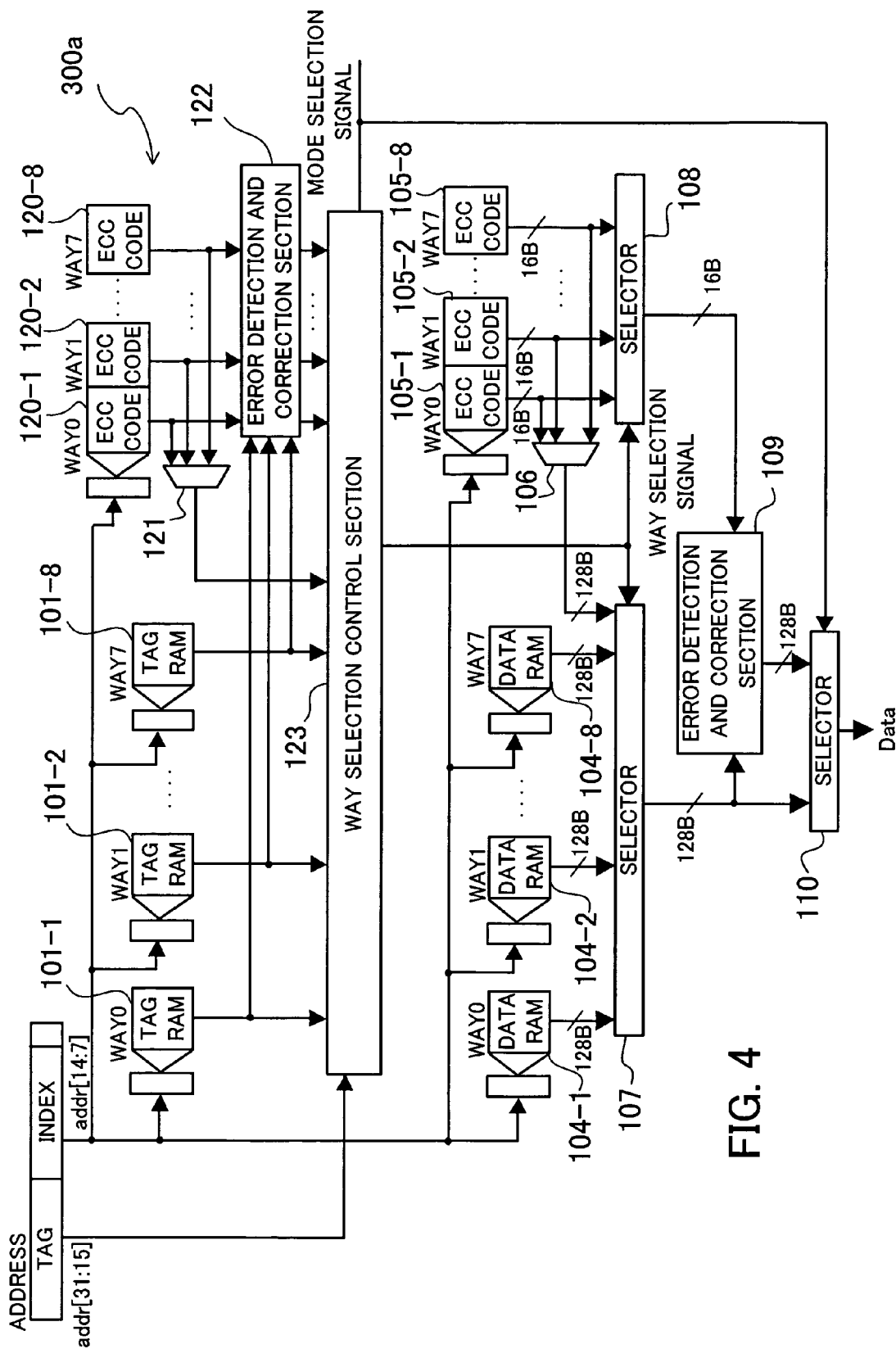
FIG. 4 shows the structure of a cache memory device according to a second embodiment of the present invention.

FIG. 4 shows the structure of a cache memory device according to a second embodiment of the present invention.

Components that are the same as those included in the cache memory device 100a according to the first embodiment of the present invention are marked with the same symbols and descriptions of them will be omitted.

A cache memory device 300a according to a second embodiment of the present invention differs from the cache memory device 100a according to the first embodiment of the present invention in that the cache memory device 300a has a memory data protection function (ECC function, in this example) for protecting data stored in tag RAMs.

When the memory data protection function is enabled, ECC code sections 120-1, 120-2, . . . , and 120-8 store ECC codes corresponding to data stored in tag RAMs 101-1 through 101-8, respectively, and read out ECC codes designated by an index address.

A data merge section 121 merges the data stored in the ECC code sections 120-1 through 120-8 and outputs it as tag information stored in a way added to the tag RAMs 101-1 through 101-8.

On the basis of the ECC codes outputted from the ECC code sections 120-1 through 120-8, an error detection and correction section 122 detects an error in the tag information stored in the tag RAMs 101-1 through 101-8 and corrects the error.

The structure of a way selection control section 123 is as follows.

Figure 5:
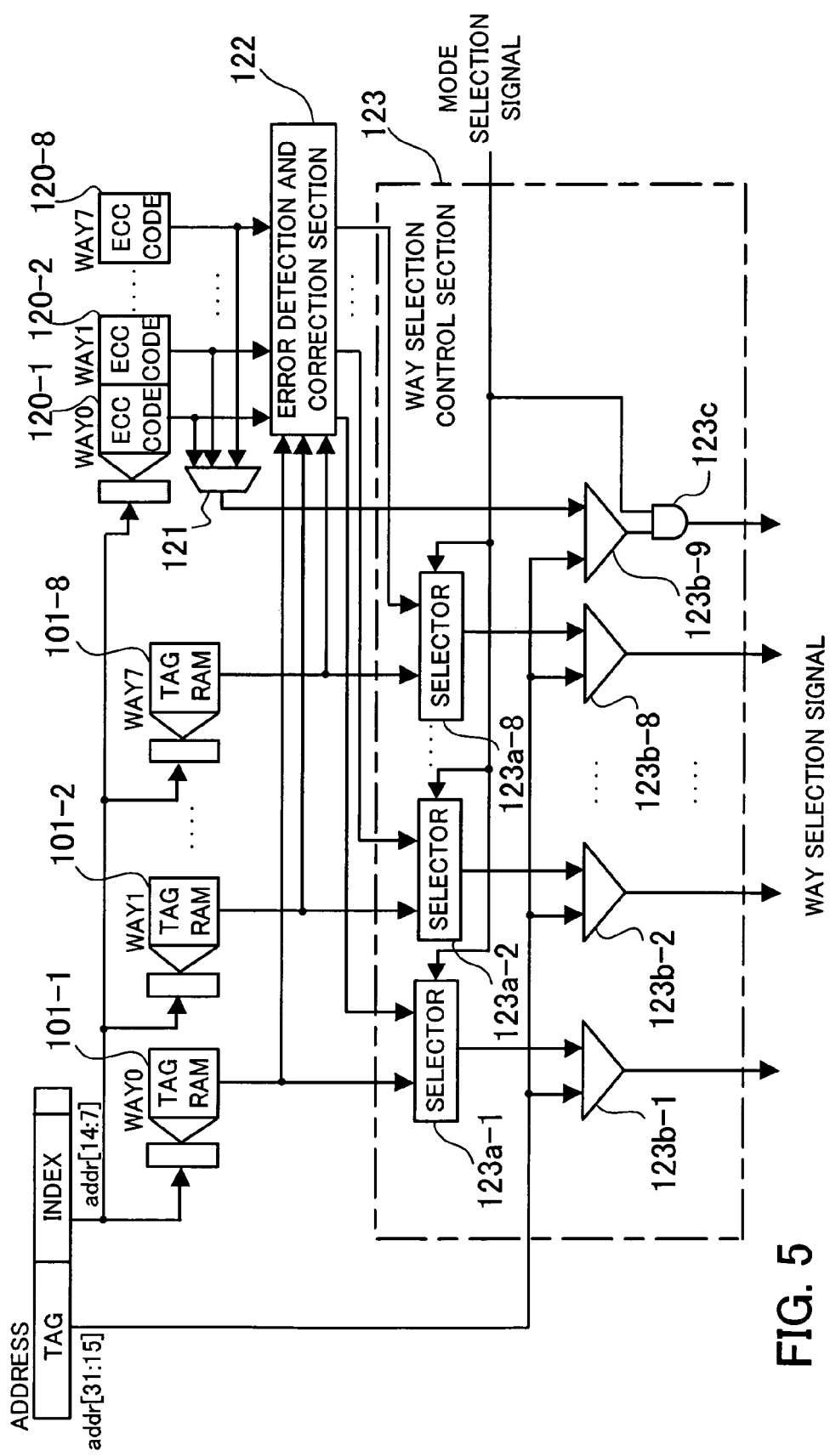
FIG. 5 shows the structure of a way selection control section included in the cache memory device according to the second embodiment of the present invention.

FIG. 5 shows the structure of a way selection control section included in the cache memory device according to the second embodiment of the present invention.

The way selection control section 123 includes selectors 123a-1, 123a-2, . . . , and 123a-8 for selecting, in accordance with a mode selection signal, tag information read out from each tag RAM or the tag information in which an error has been corrected by the error detection and correction section 122, comparators 123b-1, 123b-2, . . . , 123b-8, and 123b-9 for comparing a tag address and the tag information, and an AND circuit 123c in which output from the comparator 123b-9 is inputted to one input terminal thereof and the mode selection signal is inputted to the other input terminal thereof. The comparators 123b-1 through 123b-9 and the AND circuit 123c correspond to the comparators 102-1 through 102-9 and the AND circuit 103, respectively, shown in FIG. 1.

The operation of the cache memory device 300a according to the second embodiment of the present invention shown in FIGS. 4 and 5 will now be described.

The operation of the cache memory device 300a performed at the time the memory data protection function is enabled will be described first.

It is assumed that the CPU 10 shown in FIG. 2 includes the cache memory device 300a. This is the same with the cache memory device 100a according to the first embodiment of the present invention. When the CPU 10 accesses the main memory 20, an address designated by the processor core 200 is inputted to the cache memory device 300a.

Tag information is read out from the tag RAMs 101-1 through 101-8 by using an index address of an address designated. In addition, ECC codes are read out from the ECC code sections 120-1 through 120-8. The error detection and correction section 122 detects a 1- or 2-bit error in tag information stored in each way and corrects the 1-bit error.

When the memory data protection function is enabled, the selectors 123a-1 through 123a-8 respectively select and output, in accordance with the mode selection signal, not the tag information read out from the tag RAMs 101-1 through 101-8 but the tag information in which errors have been corrected by the error detection and correction section 122. The comparators 123b-1 through 123b-8 respectively compare the output from the selectors 123a-1 through 123a-8 (tag information in which the errors have been corrected) and the tag address and output a way selection signal for selecting data stored in a way where they match. The data which is stored in the ECC code sections 120-1 through 120-8 and which has been merged by the data merge section 121 is inputted to the comparator 123b-9 as tag information stored in the way added to the tag RAMs 101-1 through 101-8. However, output from the comparator 123b-9 is inputted to one input terminal of the AND circuit 123c and the mode selection signal ("0") which indicates that the memory data protection function is enabled is inputted to the other input terminal of the AND circuit 123c. As a result, output from the AND circuit 123c is fixed at 0. Therefore, a way selection signal for selecting the additional way is not outputted.

On the other hand, when the memory data protection function is disabled, the selectors 123a-1 through 123a-8 respectively output the tag information read out from the tag RAMs 101-1 through 101-8 in its original condition in accordance with the mode selection signal. The comparators 123b-1 through 123b-8 respectively compare the output from the selectors 123a-1 through 123a-8 (tag information) and the tag address and output a way selection signal for selecting data stored in a way where they match (data stored in one of data RAMs 104-1 through 104-8). At this time the mode selection signal ("1") which indicates that the memory data protection function is disabled is inputted to the other input terminal of the AND circuit 123c. Therefore, if the tag information stored in the additional way matches the tag address, then the AND circuit 123c outputs a way selection signal for selecting the additional way (WAY8).

Data stored in the data RAMs 104-1 through 104-8 or ECC code sections 105-1 through 105-8 is read out from a selector 107 or 108 in accordance with the way selection signal generated in the above way. Operation performed at this time is the same as that of the cache memory device 100a according to the first embodiment of the present invention, so descriptions of the operation will be omitted.

As has been described, with the cache memory device 300a according to the second embodiment of the present invention, tag information can be stored in the ECC code sections 120-1 through 120-8 as a way added to the tag RAMs 101-1 through 101-8 even when the memory data protection function is disabled. That is to say, the ECC code sections 120-1 through 120-8 can effectively be used. This improves the performance of a cache memory.

The cache memory device 300a shown in FIGS. 4 and 5 has an ECC function as a memory data protection function. However, the cache memory device 300a shown in FIGS. 4 and 5 may have a parity function in place of the ECC function.

Figure 6:
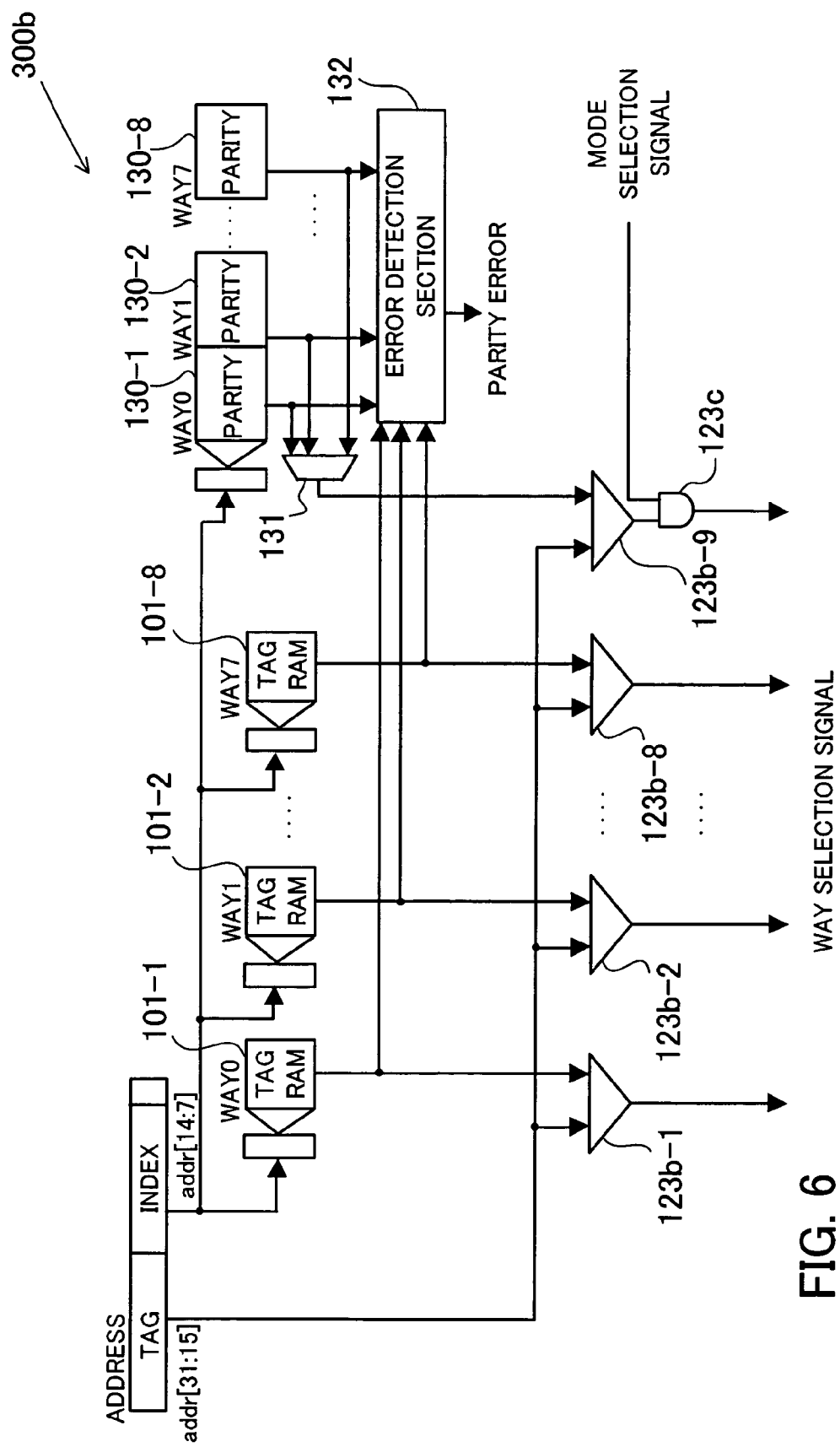
FIG. 6 shows the structure of a cache memory device with a parity function according to the second embodiment of the present invention.
Figure 7:
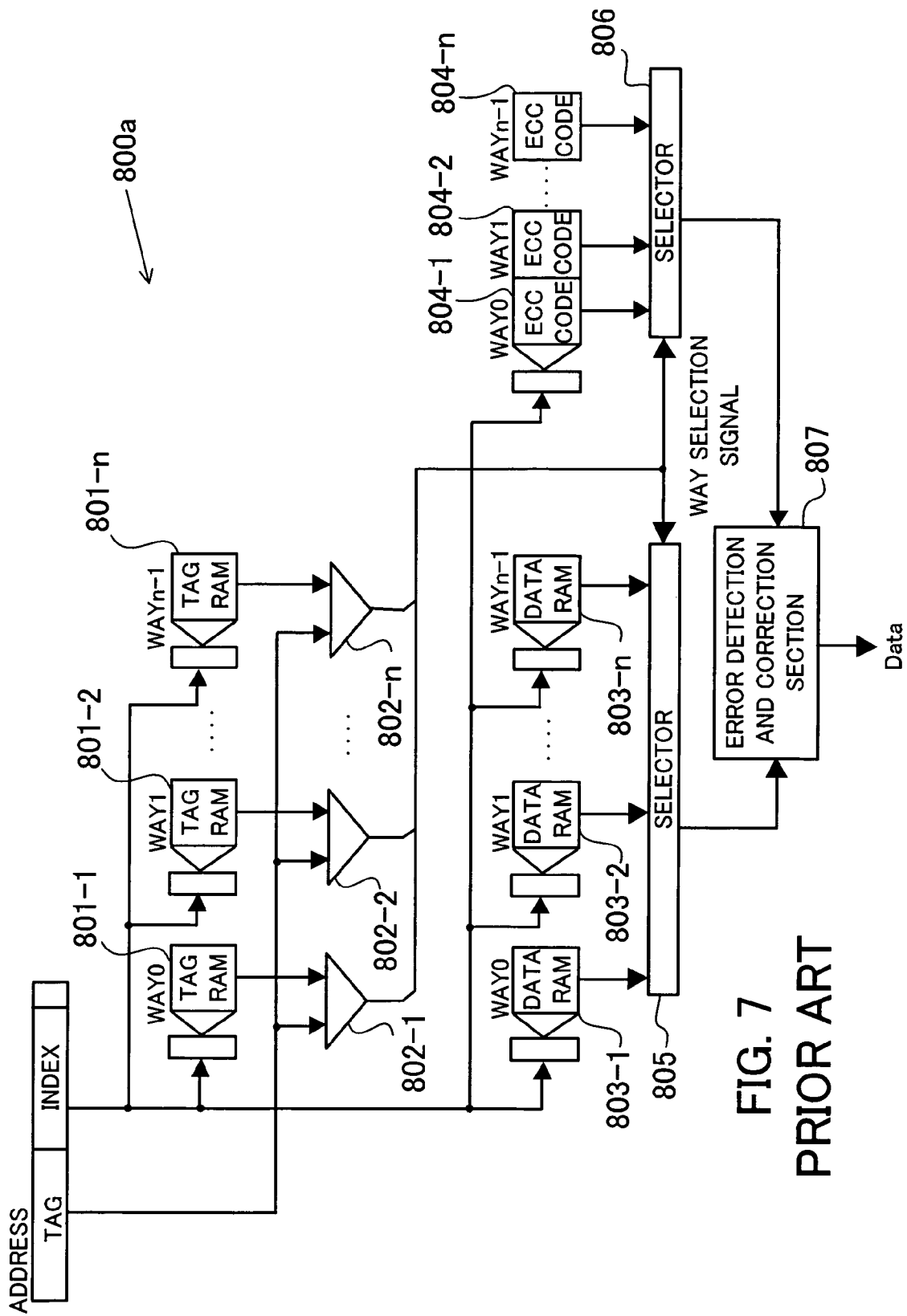
FIG. 7 shows the structure of an example of a conventional cache memory device in which an ECC function is used for data RAMs.
Figure 8:
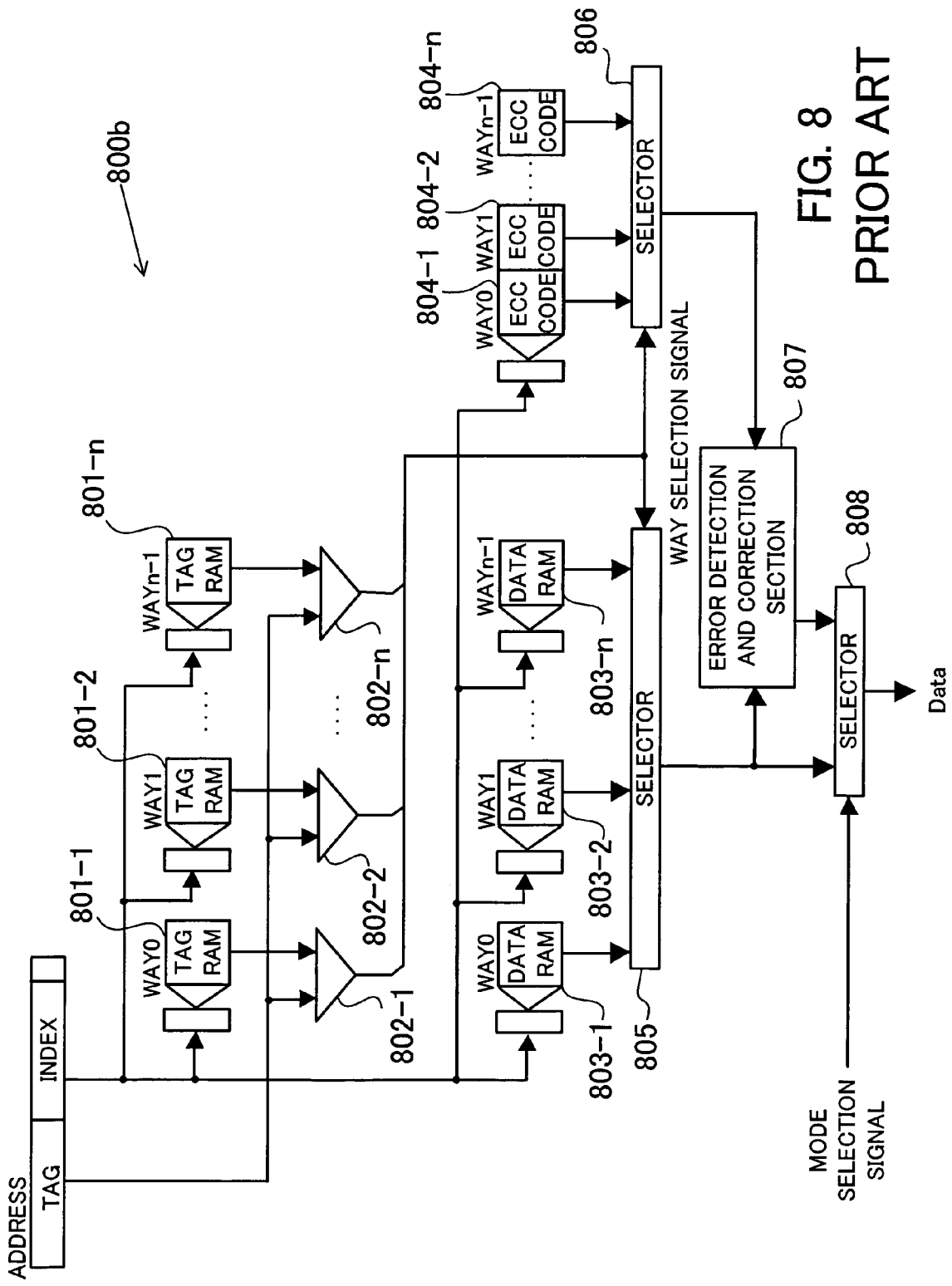
FIG. 8 shows a conventional cache memory device in which a memory data protection function can be nullified.

FIG. 6 shows the structure of a cache memory device with a parity function according to the second embodiment of the present invention.

A data RAM portion is the same as that shown in FIG. 4, so it is not shown in FIG. 6. Components that are the same as those shown in FIGS. 4 and 5 are marked with the same symbols.

A cache memory device 300b with a parity function as a memory data protection function includes parity check bit sections 130-1, 130-2, . . . , and 130-8 for storing a parity check bit which correspond to tag RAMs 101-1 through 101-8 in different ways in place of the ECC code sections 120-1 through 120-8 shown in FIGS. 4 and 5. A data merge section 131 merges data designated by using an index address and read out from the parity check bit sections 130-1 through 130-8 and inputs merged data to a comparator 123b-9 as tag information stored in a way added to the tag RAMs 101-1 through 101-8. An error detection section 132 detects a parity error in each way by using tag information stored in the tag RAMs 101-1 through 101-8 and the parity check bits read out from the parity check bit sections 130-1 through 130-8.

As stated above, when the memory data protection function is enabled, output from an AND circuit 123c is fixed by a mode selection signal. Accordingly, even if the tag information stored in the additional way (data outputted from the data merge section 131) matches a tag address, a way selection signal for selecting the additional way is not outputted. That is to say, a way selection signal for selecting one of WAY0 through WAY7 is generated.

On the other hand, when the memory data protection function is disabled, a way selection signal for selecting data stored in the additional way (data obtained by merging data read out from ECC code sections 105-1 through 105-8) is outputted from the AND circuit 123c if the tag information stored in the additional way matches the tag address.

Data stored in the data RAMs 104-1 through 104-8 or the ECC code sections 105-1 through 105-8 shown in FIG. 4 is read out from a selector 107 or 108 in accordance with the way selection signal generated in the above way. Operation performed at this time is the same as that of the cache memory device 100a according to the first embodiment of the present invention, so descriptions of the operation will be omitted.

As has been described, the parity check bit sections 130-1 through 130-8 can effectively be used as a way added to the tag RAMs 101-1 through 101-8 even when the memory data protection function is disabled. That is to say, the parity check bit sections 130-1 through 130-8 are not wasted. This improves the performance of a cache memory.

With the cache memory device 300a according to the second embodiment of the present invention, an ECC function is included on the side of the data RAMs 104-1 through 104-8. However, a parity function may be included on the side of the data RAMs 104-1 through 104-8.

The cache memory devices 100a and 100b according to the first embodiment of the present invention and the cache memory devices 300a and 300b according to the second embodiment of the present invention described above are of an 8-way set associative type (when the memory data protection function is enabled). However, they may be of a direct mapping type (1-way set associative type) or a fully associative type. In addition, there is no limit to the number of ways.

In the above examples, only one way is added to the data RAMs or the tag RAMs by using the ECC code sections or the parity check bit sections. However, two or more ways may be added. It is assumed that in FIG. 1 two or more ways are added. Then the cache memory device 100a includes a plurality of data merge sections 106 and pieces of merged data which equal the added ways in number are inputted to the selector 107. In the case of FIG. 1, the tag RAMs 101-9, the comparators 102-9, and the AND circuits 103 included in the cache memory device 100a also equal the added ways in number.

In the above examples, descriptions of the case where only the tag RAM portion includes a memory data protection function are omitted. However, the data RAM portion may not include a memory data protection function and only the tag RAM portion may include a memory data protection function. In this case, added data RAMs which can be read at the time the memory data protection function is disabled equal ways added to the tag RAMs in number.

In the present invention, the storage section which functions, at the time a memory data protection function is enabled, as a storage area for storing memory data protection data used for performing error detection or error correction on data stored in the data storage section functions as one or more ways added to the data storage section by a selection signal at the time the memory data protection function is disabled. Therefore, even when the memory data protection function is disabled, the storage area for storing memory data protection data is not wasted and can effectively be used as one or more ways added to the data storage section. This improves the performance of the cache memory device.

Moreover, the storage section which functions, at the time a memory data protection function is enabled, as a storage area for storing memory data protection data used for performing error detection or error correction on tag information stored in the tag information storage section functions as one or more ways added to the tag information storage section by a selection signal at the time the memory data protection function is disabled. Therefore, even when the memory data protection function is disabled, the storage area for storing memory data protection data is not wasted and can effectively be used as one or more ways added to the tag information storage section. This improves the performance of the cache memory device.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A cache memory device comprising:
a data storage section including one or more ways to store part of data stored in a main memory;
a tag information storage section to store tag information which differs among the one or more ways; and
a storage section that is controlled by a selection signal to, when a memory data protection function is enabled, operate as a storage area to store memory data protection data used for performing error detection or error correction on the data and, when the memory data protection function is disabled, operate as an additional one or more ways to store part of the data stored in the memory,
wherein the storage section merges data stored in the storage area for the memory data protection data corresponding to the one or more ways included in the data storage section by a specified-amount and outputs the merged data as data stored in one of the additional one or more ways.

2. The cache memory device according to claim 1, wherein the tag information storage section nullifies a signal for selecting one of the additional one or more ways on the basis of the tag information in the tag information storage section when the memory data protection function is enabled.

3. The cache memory device according to claim 1, further comprising:
a second storage section controlled by the selection signal to, when the memory data protection function is enabled, store memory data protection data used for performing error detection or error correction on the tag information at the time the memory data protection function is enabled and, when the memory data protection function is disabled, operate as an expansion of the tag information storage section.

4. The cache memory device according to claim 3, wherein the second storage section merges data stored in the second storage area for storing the memory data protection data corresponding to ways included in the tag information storage section by a specified amount and outputs the merged data as the tag information stored in the second storage section operating as the expansion of the tag information storage section.

5. A semiconductor integrated circuit comprising:
a cache memory device including:
a data storage section including one or more ways to store part of data stored in a main memory;
a tag information storage section to store tag information which differs among the one or more ways; and
a storage section that is controlled by a selection signal to, when a memory data protection function is enabled, operate as a storage area to store memory data protection data used for performing error detection or error correction and, when the memory data protection function is disabled, operate as an additional one or more ways to store part of the data stored in the memory,
wherein the storage section merges data stored in the storage area for the memory data protection data corresponding to the one or more ways included in the data storage section by a specified-amount and outputs the merged data as data stored in one of the additional one or more ways.

6. A cache control method for a cache memory device, the method comprising:
operating a storage section as a storage area for storing memory data protection data used for performing error detection or error correction on data stored in a data storage section and corresponding to a part of data stored in a main memory when a memory data protection function is enabled; and
operating the storage section as an additional one or more ways of the data storage section to store part of the data stored in the memory when the memory data protection function is disabled, the operating of the storage section being based on a received selection signal,
wherein the storage section merges data stored in the storage area for the memory data protection data corresponding to the one or more ways included in the data storage section by a specified-amount and outputs the merged data as data stored in one of the additional one or more ways.

* * * * *